United States Patent
Haigh et al.

(10) Patent No.: US 8,674,486 B2
(45) Date of Patent: Mar. 18, 2014

(54) ISOLATION BARRIER DEVICE AND METHODS OF USE

(75) Inventors: Geoffrey T Haigh, Boxford, MA (US); Matthew Kuhn, Atlanta, GA (US); Patrick Melet, Sandy Springs, GA (US); Romain Pelard, Atlanta, GA (US); Jae Joon Chang, Johns Creek, GA (US); Youngsik Hur, Alpharetta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 36 days.

(21) Appl. No.: 13/325,582

(22) Filed: Dec. 14, 2011

(65) Prior Publication Data

US 2013/0154071 A1    Jun. 20, 2013

(51) Int. Cl.
 *H01L 23/495* (2006.01)
(52) U.S. Cl.
 USPC .................................. 257/676; 257/E23.052
(58) Field of Classification Search
 None
 See application file for complete search history.

(56) References Cited

U.S. PATENT DOCUMENTS

| | | | |
|---|---|---|---|
| 5,200,642 A | 4/1993 | Long | |
| 5,401,680 A | 3/1995 | Abt | |
| 5,870,046 A | 2/1999 | Scott | |
| 6,107,948 A | 8/2000 | Scott | |
| 6,225,927 B1 | 5/2001 | Scott | |
| 6,297,755 B2 | 10/2001 | Scott | |
| 6,389,061 B1 | 5/2002 | Scott | |
| 6,430,229 B1 | 8/2002 | Scott | |
| 6,570,513 B2 | 5/2003 | Scott | |
| 6,611,553 B1 | 8/2003 | Scott | |
| 6,728,320 B1 | 4/2004 | Khasnis | |
| 7,089,475 B1 | 8/2006 | Krone | |
| 7,154,940 B2 | 12/2006 | Scott | |
| 7,203,224 B2 | 4/2007 | Scott | |
| 7,863,762 B2 | 1/2011 | Sheats | |
| 7,902,627 B2 | 3/2011 | Dong | |
| 7,964,964 B2 | 6/2011 | Sheats | |
| 8,004,863 B2 | 8/2011 | Schopfer | |
| 8,427,844 B2 * | 4/2013 | Ho et al. ........................ 361/813 |

OTHER PUBLICATIONS

Mitchell Kline, "Capacitive Power Transfer", Dec. 15, 2010, Technical Report No. UCB/EECS-2010-155.
James R. Webster "Thin Film Polymer Dielectrics for High-Voltage Applications under Severe Environments" May 26, 1998, Virginia Polytechnic Institute and State University.
"CMOS Digital Isolators Supersede Optocouplers in Industrial Applications," Rev 0.2, Silicon Labs, Oct. 28, 2010.

* cited by examiner

*Primary Examiner* — Thien F Tran

(57) ABSTRACT

Systems and methods pertaining to a digital signal isolator device are described. In one embodiment, the device includes an isolation barrier and two metal support paddles. The isolation barrier contains an organic and/or a semi-organic insulating material with at least one capacitor embedded inside. One of the two metal support paddles is located below a first portion of a bottom surface of the isolation barrier to provide support to the isolation barrier, while the other metal support paddle is located below a second portion of a bottom surface of the isolation barrier to provide support to the isolation barrier.

9 Claims, 11 Drawing Sheets

US 8,674,486 B2

ISOLATION BARRIER DEVICE AND METHODS OF USE

DESCRIPTION OF THE RELATED ART

Numerous hurdles need to be overcome when propagating digital data from a transmit side domain to a receive side domain across an intermediate isolation barrier. These hurdles become even more significant when electronic circuitry located in each of the two domains use two different ground potential references (as is often the case).

Amongst the numerous hurdles, a first one pertains to overcoming the adverse effects of common mode voltage transients that may exist in the two domains as a result of the two different ground potential references. The adverse effects of such common mode voltage transients may be mitigated to some extent by incorporating an isolation barrier of an appropriate material between the two domains. However, devices that include such an isolation barrier are not necessarily easy to fabricate because selection of a suitable material for the isolation barrier often involves accepting a trade-off between certain benefits and certain handicaps.

For example, a material that provides a desired level of electrical isolation may have certain undesirable mechanical characteristics, and/or suffer cost issues.

Furthermore, a material that provides a desired level of electrical isolation during normal operation of the device may provide an unacceptable level of performance when the device is subjected to an adverse condition such as, for example a deterioration of the packaging. Package deterioration may take place as a result of various causes, including device aging and/or abnormal operating conditions (electrical anomalies, hostile environment, mechanical stress, etc).

To elaborate upon some of these aspects, attention is drawn to a prior art device 100 shown in FIG. 1. Device 100 will be used to describe certain circuit-related aspects that may be pertinent to the topic of electrical isolation between two domains. Though the description will be based on one direction of signal transmission, one of ordinary skill in the art can understand a similarity in operation in the opposite direction as well.

While various mechanisms exist in the manner by which a transmit side domain is coupled to a receive side domain (optical, inductive, capacitive, etc.), the example configuration shown in FIG. 1 provides for capacitive coupling between a transmit circuit 112 and a receive circuit 116 located in two separate domains. Specifically, capacitive coupling is provided by a first capacitor 113 (shown as a parallel plate capacitor) located on a first isolator die 105 and a second capacitor 114 located on a second isolator die 110. The two capacitors are connected to each other via a bonding wire 131 that is bonded to bonding pads on each of the two dies.

Isolator dies 105 and 110 are mounted upon a substrate 115, which is typically formed of a silicon-based material, such as silicon-dioxide. The use of such a substrate permits the device to be fabricated using standard complementary metal oxide semiconductor (CMOS) process technology and standard integrated circuit (IC) packaging techniques. As can be understood, the use of such standard materials and packaging techniques are advantageous in terms of pricing and existing manufacture practice. However, these advantages have to be weighed in the context of certain trade-offs.

One example of such a trade-off pertains to an issue that is generally known in the industry as creepage. Creepage may be broadly described as the formation of an undesirable conduction path across a surface of a device, as a result of a mechanical failure in the packaging of the device. Such a failure may be caused by various phenomena such as for example, a corona discharge or an environmental stress that exceeds normal operating levels.

It would be desirable to minimize adverse effects of creepage by, for example, using appropriate materials and circuit configurations in devices that incorporate an isolation barrier. Minimizing such adverse effects provides for improved reliability and performance of such devices.

It would also be desirable to make certain improvements to existing manufacturing practice. Such improvements can include the reduction/elimination of one or more operations that are carried out upon currently used materials. For example, it may be desirable to eliminate certain operations that are currently carried out as a part of silicon wafer processing during manufacture of an integrated circuit.

SUMMARY

According to a first aspect of the disclosure, a digital signal isolator device is provided. The digital signal isolator device includes an isolation barrier and two metal support paddles. The isolation barrier contains an organic and/or a semi-organic insulating material with a capacitor comprising a pair of parallel capacitor plates embedded inside. One of the two metal support paddles is located below a first portion of a bottom surface of the isolation barrier to provide support to the isolation barrier, while the other metal support paddle is located below a second portion of a bottom surface of the isolation barrier to provide support to the isolation barrier.

According to a second aspect of the disclosure, a digital signal isolator device includes an isolation barrier comprising at least one of an organic or a semi-organic insulating material, the isolation barrier having a first portion supported by the first metal support paddle and a second portion supported by the second metal support.

According to a third aspect of the disclosure, a digital signal isolator device includes an isolation barrier that bridges two metal support paddles. The isolation barrier contains an organic and/or a semi-organic insulating material.

Further aspects of the disclosure are shown in the specification, drawings and claims below.

BRIEF DESCRIPTION OF THE DRAWINGS

Many aspects of the invention can be better understood with reference to the following drawings. The components in the drawings are not necessarily to scale. Instead, emphasis is placed upon clearly illustrating the principles of the invention. Moreover, in the drawings, like reference numerals designate corresponding parts, or descriptively similar parts, throughout the several views and embodiments.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as upper, lower, top, bottom, pins, pads, wires are used herein as a matter of convenience for description purposes and should not be interpreted in a limiting manner. As one can appreciate, the word "upper" used in a first context may be referred to as "lower" in a different context, and consequently, such terms should be interpreted solely to understand the invention rather than to circumvent it, for example, by flipping an object upside down, or mirroring the object.

Also, the various elements described below may be mounted on various surfaces using various mounting techniques, such as by using an adhesive or by ultrasonic bonding. However, such mounting elements are not described herein or shown in the various figures so as to avoid obfuscation of the primary subject matter. It will therefore be understood that any reference herein of mounting an element upon a surface implies that the element may be mounted using intermediate elements, such as an adhesive or a solder, or may be directly attached to the surface using an ultrasonic bond for example.

It must also be understood that the word "example" as used herein (in whatever context) is intended to be non-exclusionary and non-limiting in nature. Specifically, the word "exemplary" indicates one among several examples, and it must be understood that no special emphasis is intended or suggested for that particular example. A person of ordinary skill in the art will understand the principles described herein and recognize that these principles can be applied to a wide variety of applications using a wide variety of physical elements.

The various embodiments generally describe systems and methods related to an isolation barrier. In particular, described herein are some systems and methods pertaining to the structure, manufacture, and materials used in a device incorporating an isolation barrier.

Figure 1:
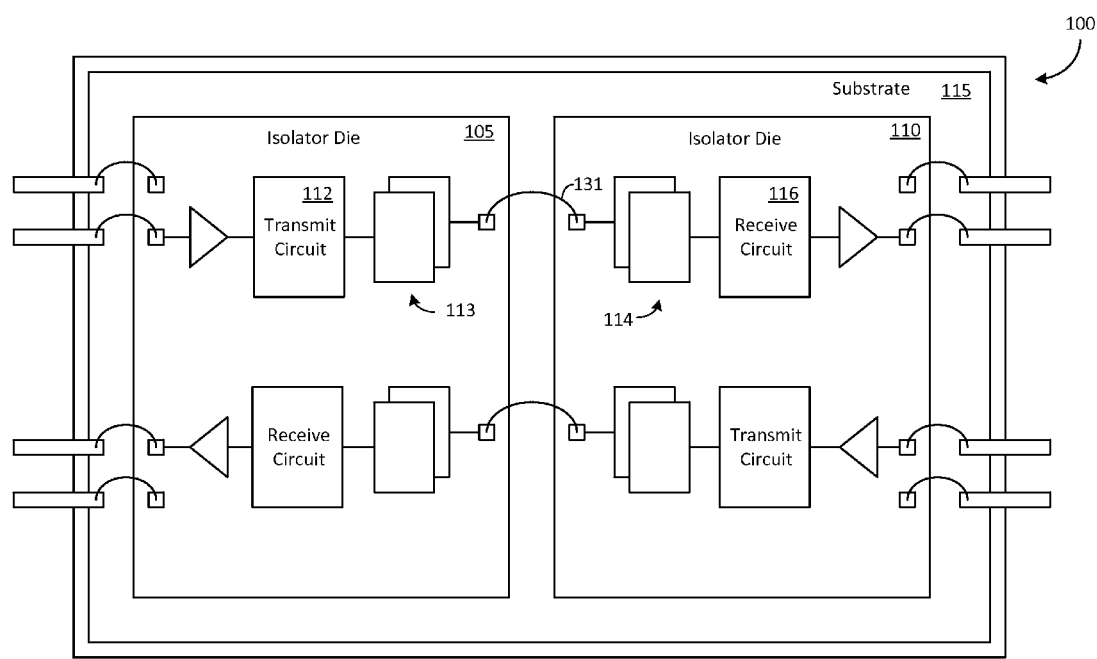
FIG. 1 shows a prior art device incorporating circuitry that provides electrical isolation between two dies that are mounted upon a CMOS substrate.
Figure 2:
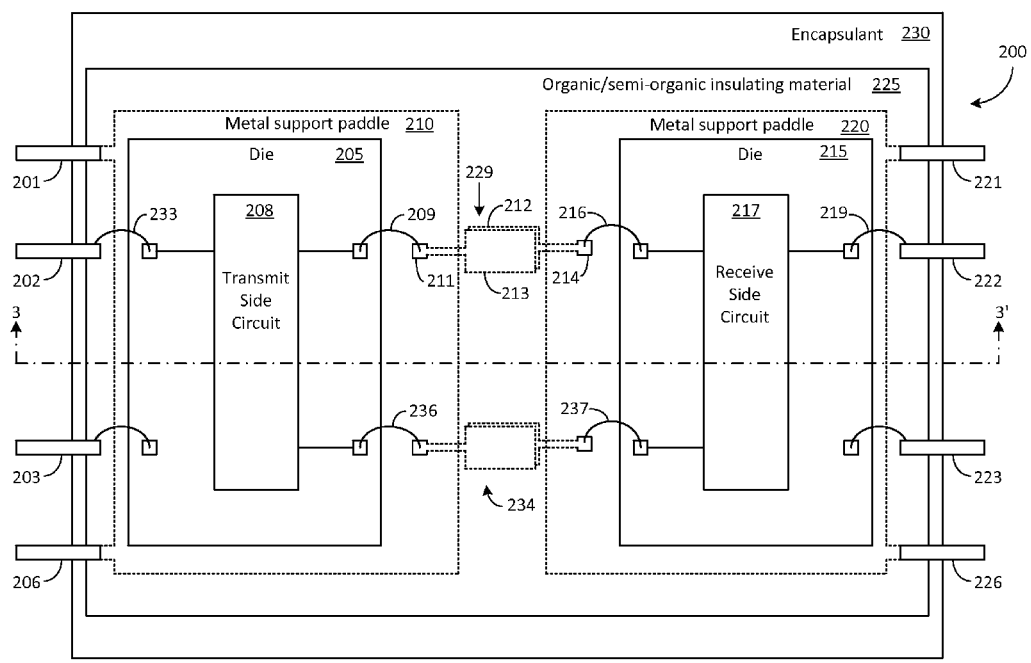
FIG. 2 shows a first exemplary embodiment of an isolation barrier device in accordance with invention.

Attention is now drawn to FIG. 2, which shows a first exemplary embodiment of an isolation barrier device 200 in accordance with invention. Device 200 includes a first die 205 coupled to a second die 215 through a galvanic isolation barrier formed of an insulating material 225 in which two capacitors 229 and 234 are embedded. The two capacitors 229 and 234, each of which includes a pair of parallel capacitor plates, permit signal transmission in a differential format from two terminals of transmit side circuit 208 to two terminals of receive side circuit 217, through the galvanic isolation barrier.

Details pertaining to transmit side circuit 208 and receive side circuit 217 are not provided herein so as to avoid obscuring the primary aspects of the invention, which are not directly impacted by the nature of these two circuits. As can be understood, the two circuits can be diverse in nature and encompass a wide multitude of applications.

Die 205 is mounted at a first location (left side in FIG. 2) upon insulating material 225, which in turn is supported by two metal support paddles (shown in dashed line outline below insulating material 225). In this embodiment, first metal support paddle 210 includes two pins 201 and 206 that are externally-accessible pins of device 200. Device 200 includes several other externally-accessible pins (such as pin 203, which is shown connected via a bonding wire into a part of circuitry (not shown), for example, a power supply circuit that may be located upon die 205).

Pin 202 is an externally-accessible pin of device 200 that has a bonding wire connection 233 to a bonding pad located on die 205. Pin 202 may be used to inject an external signal into one or more terminals (not shown) of transmit side circuit 208. This signal is operated upon by transmit side circuit 208 and coupled in a differential signal format through a first bonding wire connection 209 into capacitor 229 and a second bonding wire connection 236 into capacitor 234. Specifically, each of the bonding wire connections 209 and 236 are coupled into a first plate of respective capacitors 229 and 234. As shown in FIG. 2, bonding wire connection 209 is connected via bond pad 211 to a first plate 213 of capacitor 229. The second plate 212 of capacitor 229 is connected to die 215 via bond pad 214 and bonding wire 216. Capacitor 234 is connected in a similar manner.

Die 215, which is mounted at a second location (right side in FIG. 2) upon insulating material 225, is coupled to externally-accessible pins 221, 222, 223, and 226 in a manner similar to that described above with reference to die 205. Encapsulant 230 may be a traditional material such as a plastic or ceramic compound that forms a protective casing of device 200.

Insulating material 225 that is part of the isolation barrier may be selected to contain one or more organic and/or semi-organic materials. The selection of this material is based on a number of parameters, such as, for example, a desired level of electrical isolation between dies 205 and 215, a desired level of mechanical integrity under adverse conditions, desirable manufacturing features, and desired product cost.

In a first implementation, insulating material 225 is an organic insulating material, such as, for example, a polyimide material. In this case, the isolation layer may be formed of one or more layers of polyimide film in a laminated structure with the parallel capacitor plates of capacitors 229 and 234 embedded within. The structure will be described below in more detail using additional figures.

The polyimide material provides a number of benefits over traditional materials such as complementary metal oxide semiconductor (CMOS). For example, an isolation barrier formed of polyimide is more cost effective as a result of a reduced number of operations during manufacture of the device, unlike a CMOS substrate for example, which requires several post-processing steps after one or more dies are mounted on the substrate.

Furthermore, the type of polyimide used can be determined on the basis of a desired dielectric breakdown voltage or a desired dielectric constant (which affects the capacitance value obtained from capacitors 229 and 234). As a non-limiting example, a polyimide isolation barrier may be selected to provide a dielectric breakdown range of 197-272 (V/um) and/or a dielectric constant range of 2.7-3.1. Also, the thickness of the polyimide material can be varied either by selecting a material of a suitable thickness, or by using multiple layers of the material, in accordance with a desired level of electrical isolation and voltage breakdown rating.

Polyimide material also provides certain self-healing characteristics that minimizes or eliminates various adverse effects that may be encountered when device 200 suffers damage as a result of various phenomena such as a corona discharge for example. Specifically, the self-healing nature of the polyimide material inhibits or eliminates adverse effects associated with certain types of creepage.

In some applications, the use of polyimide in the form of a polyimide film provides certain advantages over processes wherein multiple layers of polyimide material are deposited upon a silicon substrate. Such multiple layers may necessitate post-processing and may also include maximum thickness limitations, which can be overcome by the use of a plurality of films rather than by depositing multiple layers of the polyimide material.

In a second implementation, insulating material 225 is an organic insulating material, such as, for example, a photopolymer film. One particular type of photopolymer film provides a dielectric breakdown of around 530 V/um and/or a dielectric constant of around 2.65. These values may be applicable for use in certain specific applications.

The photopolymer material may include benzocyclobutene (BCB), which provides certain desirable mechanical and electrical properties. The electrical properties include dielectric properties that may be used for forming capacitors in accordance with the invention.

In a third implementation, insulating material 225 is a semi-organic insulating material, which includes various types of silicon-carbon based compounds. One example of a semi-organic insulating material is teflon.

Figure 3:
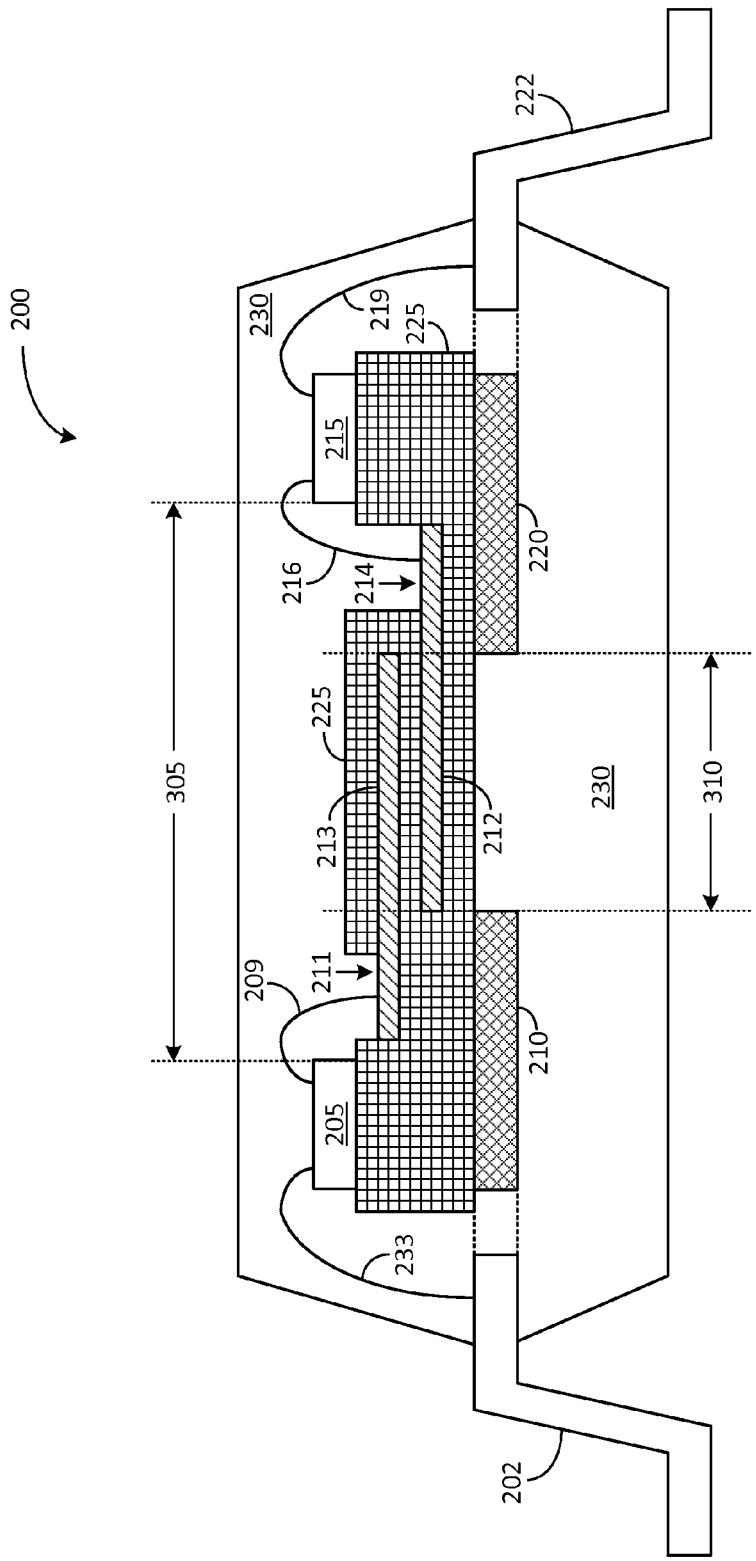
FIG. 3 provides a cross-sectional view of the isolation barrier device shown in FIG. 2.

Attention is now drawn to FIG. 3, which provides a cross-sectional view of isolation barrier device 200. The cross-sectional view is provided with reference to axis 3-3' indicated in FIG. 2. As mentioned above, die 205 is mounted at a first location (the left side) upon insulating material 225. Metal support paddle 210, which provides support to insulating material 225 underneath the first location, integrally includes externally-accessible pin 201 (not shown). Externally-accessible pin 202 is connected to die 205 via bonding wire 233. Die 215 is similarly mounted at a second location (the right side) upon insulating material 225. Metal support paddle 220, which provides support to insulating material 225 underneath the second location, integrally includes externally-accessible pin 221 (not shown). Externally-accessible pin 222 is connected to die 215 via bonding wire 230.

The parallel capacitor plates 213 and 212 of capacitor 229 are embedded inside insulating material 225 as shown. Attention is specifically drawn to area 310, which provides capacitive coupling action for signals transmitted via bonding wire 209 to bonding wire 216. Area 310 has a structure that may be viewed as a laminated structure (or a sandwich structure) with insulating material 225 constituting the upper, intermediate, and lower layers of the structure. As can be understood, the properties of the material contents of insulating material 225 determines various capacitive and isolation parameters. For example, the dielectric constant of the material plays a contributory role in the capacitance value of capacitor 229, while the breakdown characteristics plays a contributory role in the electrical isolation that can be achieved between die 205 and die 215. The thickness and amount of insulating material 225 provided above, below and/or between capacitor plates 213 and 212 may also be suitably tailored to obtain desired capacitive and isolation parameters.

The electrical isolation between die 205 and die 215 may be further enhanced by increasing distance 305 between the two dies. This increase in electrical isolation, which provides certain benefits in terms of creepage effects, has to be balanced against the related increase in packaging dimensions of the device.

It may be noticed that in this embodiment, metal support paddles 210 and 215 do not extend into area 310, or in other words, do not extend below the parallel arrangement of capacitor plates 213 and 212. However, in certain other embodiments, metal support paddles 210 and 215 may each extend to some extent into area 310 without actually coming in contact with each other (thereby maintaining electrical isolation between the two metal support paddles in order to maintain electrical isolation between the transmit and receive domains).

Figure 4:
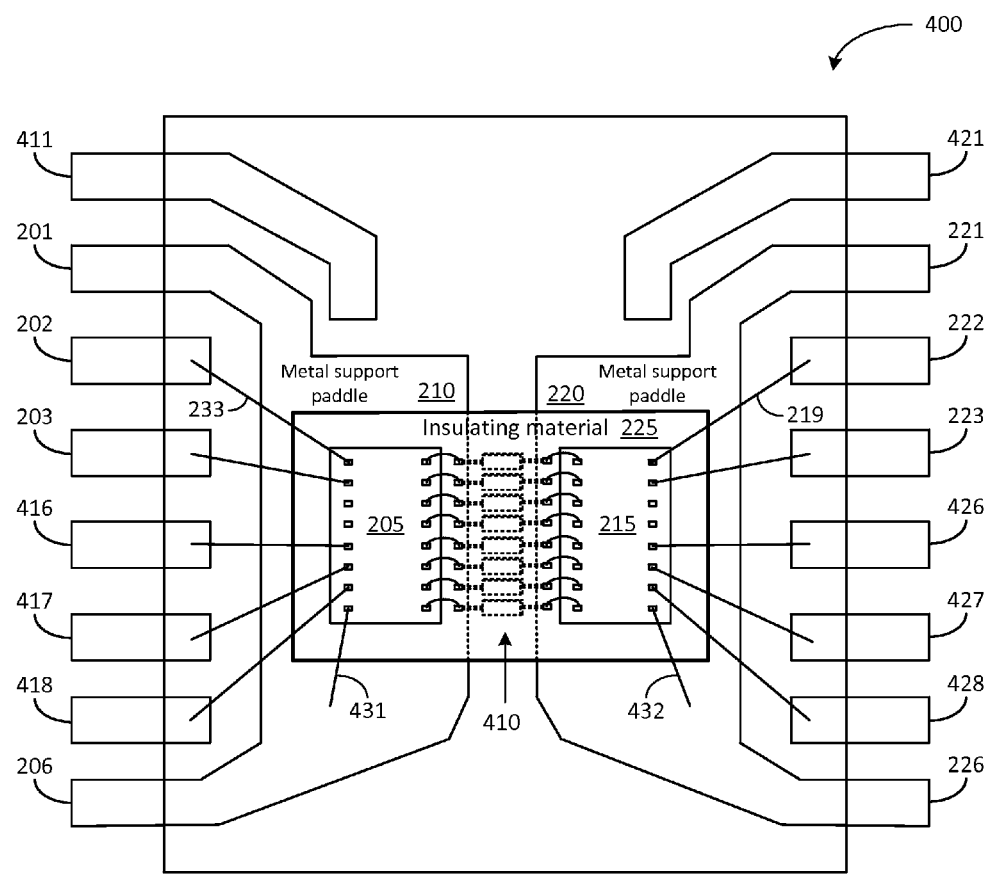
FIG. 4 shows a second exemplary embodiment of an isolation barrier device in accordance with invention.

FIG. 4 shows an isolation barrier device 400 in a second exemplary embodiment in accordance with invention. In this embodiment, which is a top view, isolation barrier device 400 is fabricated using a lead frame. Certain details pertaining to the lead frame will be described below in more detail using FIG. 5.

In this second exemplary embodiment, insulating material 225 is provided in a bridge configuration that is supported on either side by metal support paddles 210 and 220. Coupling between die 205 and die 215 is provided through an array of capacitors 410, which in this example embodiment includes eight capacitors. The array of capacitors 410 can be adapted to a wide range of applications.

For example, in a first application, the eight capacitors may be configured to couple eight single ended signals from die 205 to die 215.

In a second application, the eight capacitors may be configured to couple four differential signals from die 205 to die 215. Furthermore, one or more of the four pairs of capacitors used for coupling the four differential signals may be used as a redundant signal path that may be used to accommodate failures in one or more of the signal paths. Using one pair of capacitors as a redundant signal path provides for N:1 protection (where N≥1). When using more than one pair as redundant signal paths, N:M protection is provided (where N≥1, M>1).

In a third application, the eight capacitors may be configured to couple a combination of single-ended signals and differential signals from die 205 to die 215. The single-ended signals may include control and/or status signals, while the differential signals may be digital signals that are referenced to two different local grounds in the two different dies 205 and 215.

In terms of connectivity, bonding wire 431 couples a terminal of die 205 to pins 201 and 206 via metal support paddle 210. Pins 201 and 206 are externally-accessible pins that may be connected to a first local ground in a first domain when isolation barrier device 400 is mounted on a printed circuit board (PCB) for example. Structure and functionality of bonding wire 432 is similar to that of bonding wire 431. Externally-accessible pins 221 and 226 of metal support paddle 220 may be connected to a second local ground in a second domain when isolation barrier device 400 is mounted on the PCB. Additional bond wires may be used to couple various other terminals of dies 205 and 215 to externally-accessible pins such as pins 203, 416, 417, 418, 223, 426, 427 and 428. Pins 411 and 421 are shown as no-connect (NC) pins in this exemplary embodiment.

Figure 5:
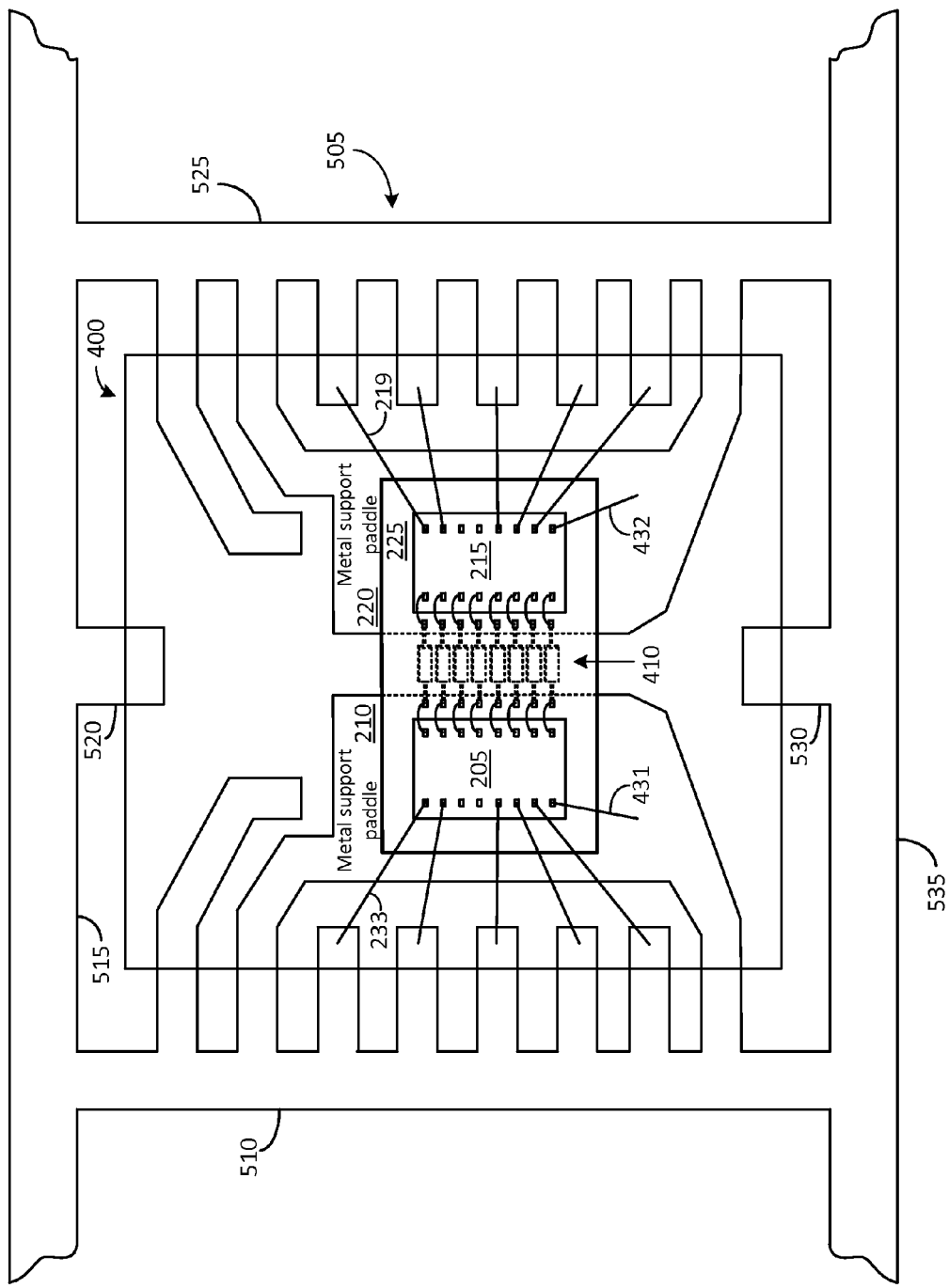
FIG. 5 shows the isolation barrier device of FIG. 4 attached to a lead frame carrier.

FIG. 5 shows isolation barrier device 400 of FIG. 4 attached to a lead frame carrier 505. Lead frame carrier 505 is typically used during manufacture and product testing of isolation barrier device 400. Even though only one device (isolation barrier device 400) is shown attached to lead frame carrier 505 it will be understood that several more similar devices may be attached to lead frame carrier 505.

As one of the steps during manufacture of a plurality of devices, vertical members 510 and 525 are eliminated using a singulating machine, thereby permitting independent access to each of the externally-accessible pins of isolation barrier device 400. Isolation barrier device 400 remains attached to lead frame carrier 505 by tie bars 520 and 530. Similarly, each of the plurality of devices (not shown) remains attached to lead frame carrier 505 by respective tie bars, thereby permitting automated testing of multiple devices in a product manufacturing line.

Product testing may be performed by placing isolation barrier device 400 upon an automated test equipment (ATE), injecting suitable signals into one or more of the externally-accessible pins of isolation barrier device 400, and monitoring one or more output signals on other externally-accessible pins of isolation barrier device 400. Once product testing is completed, isolation barrier device 400 is separated from lead frame carrier 505 by singulating tie bars 520 and 530. Certain intermediate and/or additional steps have not been described above in the interests of brevity.

Figure 6:
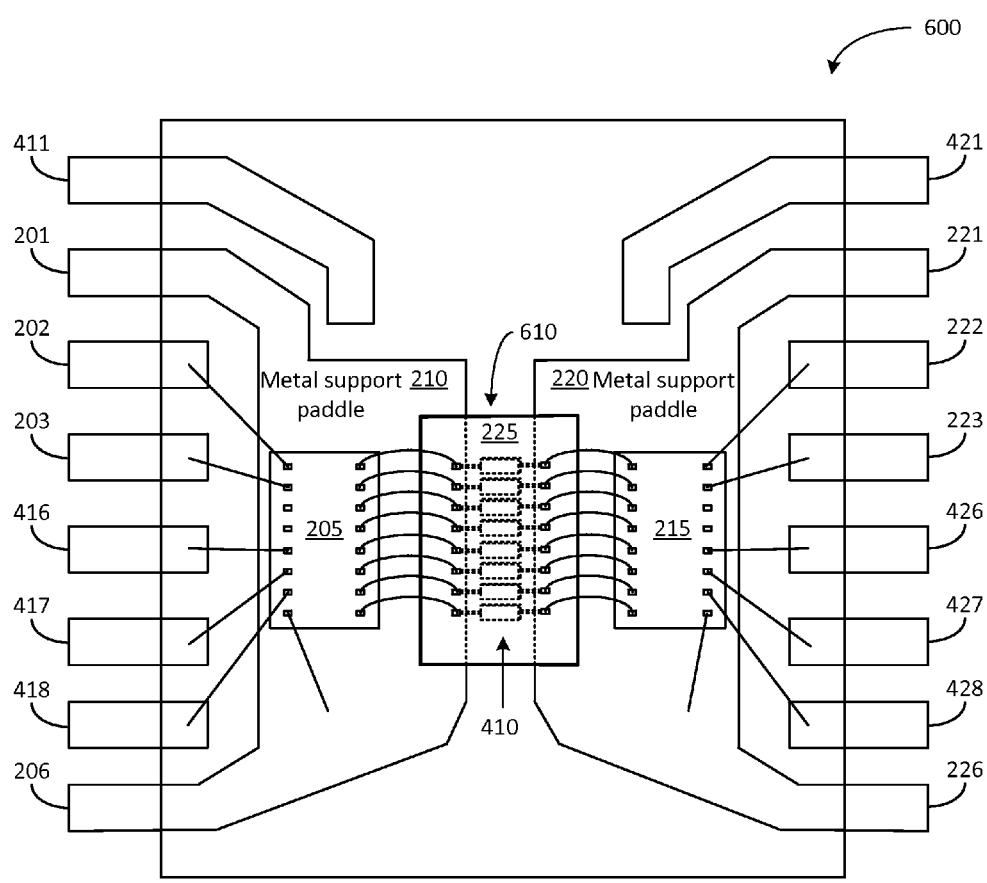
FIG. 6 shows a third exemplary embodiment of an isolation barrier device in accordance with invention.

FIG. 6 shows a third exemplary embodiment of an isolation barrier device 600 in accordance with invention. Unlike the other embodiments described above, where each of dies 205 and 215 is mounted upon insulating material 225, in this embodiment, each of dies 205 and 215 is mounted upon metal support paddles 210 and 220 respectively. Furthermore, array of capacitors 410 is incorporated into insulating material 225 in the form of an isolation barrier assembly 610. Such an arrangement may provide certain benefits in terms of accommodating independent manufacture of isolation barrier assembly 610 prior to installing inside isolation barrier device 600. Thus, die 205, die 220 and insulating barrier assembly 610 may be three separate assemblies that are individually mounted upon metal support paddles 210 and 220.

In this exemplary embodiment, isolation barrier assembly 610 bridges metal support paddles 210 and 220, and each of the remaining portions of metal support paddles 210 and 220 (which may be referred to herein as extension portions), are used for mounting dies 205 and 215.

Figure 7:
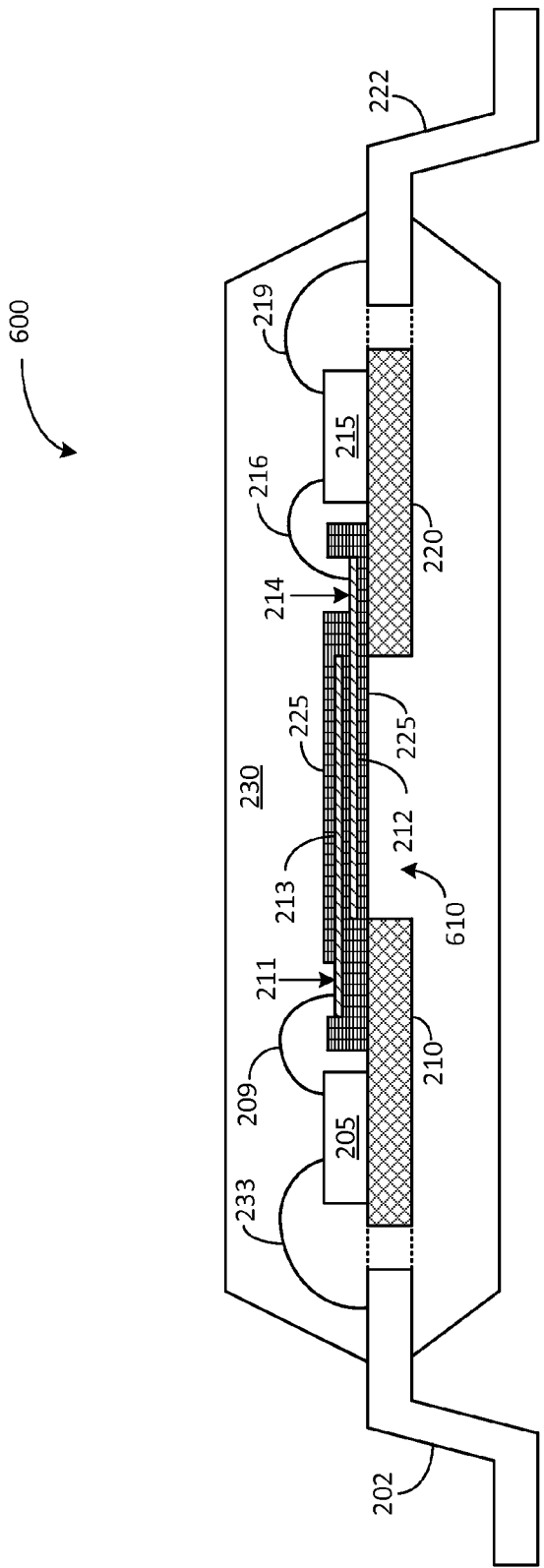
FIG. 7 provides a cross-sectional view of the isolation barrier device shown in FIG. 6.

FIG. 7 provides a cross-sectional view of isolation barrier device 600 that is shown in FIG. 6. Attention is specifically drawn to die 205 that is mounted on metal support paddle 210, die 215 that is mounted on metal support paddle 220, and isolation barrier assembly 610 which bridges the two metal support paddles. One end of isolation barrier assembly 610 is supported by metal support paddle 210, while the other end is supported by metal support paddle 220.

Attention is further drawn to the reduced height profile of isolation barrier device 600 in comparison to, for example, isolation barrier device 200 shown in FIG. 3. As can be understood, this reduced height profile is attributable, at least in part, to mounting of the dies on the metal support paddles rather than on the insulating material. In one implementation, the top surface of each die 205 and 215 may be substantially co-planar to the top surface of isolation barrier assembly 610. In other implementations, the top surface of each die 205 and 215 may be slightly lower or higher than the top surface of isolation barrier assembly 610.

Figure 8:
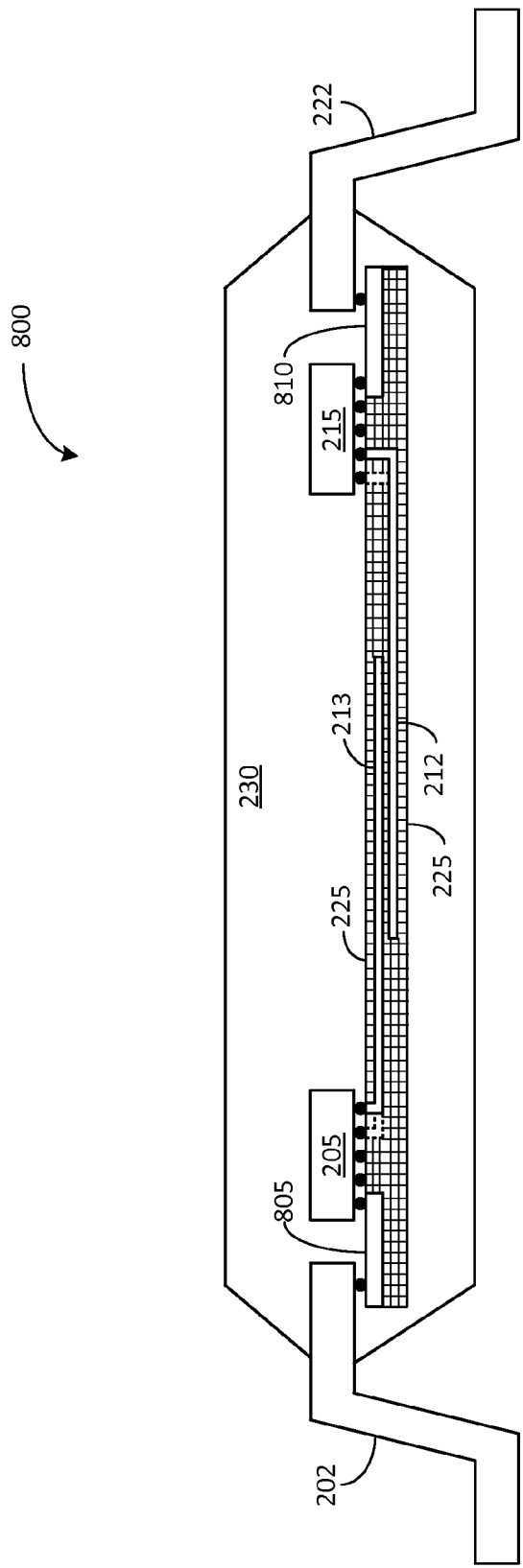
FIG. 8 provides a cross-sectional view of a fourth exemplary embodiment of an isolation barrier device in accordance with invention.

FIG. 8 provides a cross-sectional view of a fourth exemplary embodiment of an isolation barrier device 800 in accordance with invention. This embodiment illustrates the use of flip-chip techniques and provides a reduced height profile attributable, at least in part, to the absence of bonding wires and elimination of externally-accessible pins such as of the kind described above with reference to isolation barrier device 200 of FIG. 3. As can be understood, the externally-accessible pins of isolation barrier device 200 necessitates providing of a air gap between isolation barrier device 200 and a mounting surface upon which the device is mounted. In contrast, isolation barrier device 800 is mounted substantially flush with a mounting surface.

Each of dies 205 and 215 incorporates packaging directed at accommodating flip-chip mounting. As such, the externally-accessible pins of each die is located underneath the package and are attached to mounting pads (not shown) located on the surface of insulating material 225. Also included upon the surface of insulating material 225 are metal connection elements that are used for providing connectivity to externally-accessible pins such as pins 202 and 222 that are shown in FIG. 8. When the metal connection elements are metal tracks, such metal tracks may also be located in one or more internal layers of insulating material 225.

To elaborate upon the metal connection elements, attention is drawn to element 805, which is a metal track that includes a mounting pad to which externally-accessible pin 202 is bonded. The metal track terminates on another bonding pad to which a pin of die 205 is bonded. Element 810 is similar to element 805 and provides connectivity between externally-accessible pin 222 and a pin of die 215. Other metal connection elements may be used to provide connectivity between other pins of each of dies 205 and 215 and externally-accessible pins of isolation barrier device 800.

As for the capacitor, first plate 213 of the parallel plate metal capacitor embedded inside insulating material 225 is connected to a pin of die 205 as shown, while a second plate 212 of the parallel plate metal capacitor embedded inside insulating material 225 is connected to a pin of die 215.

Figure 9:
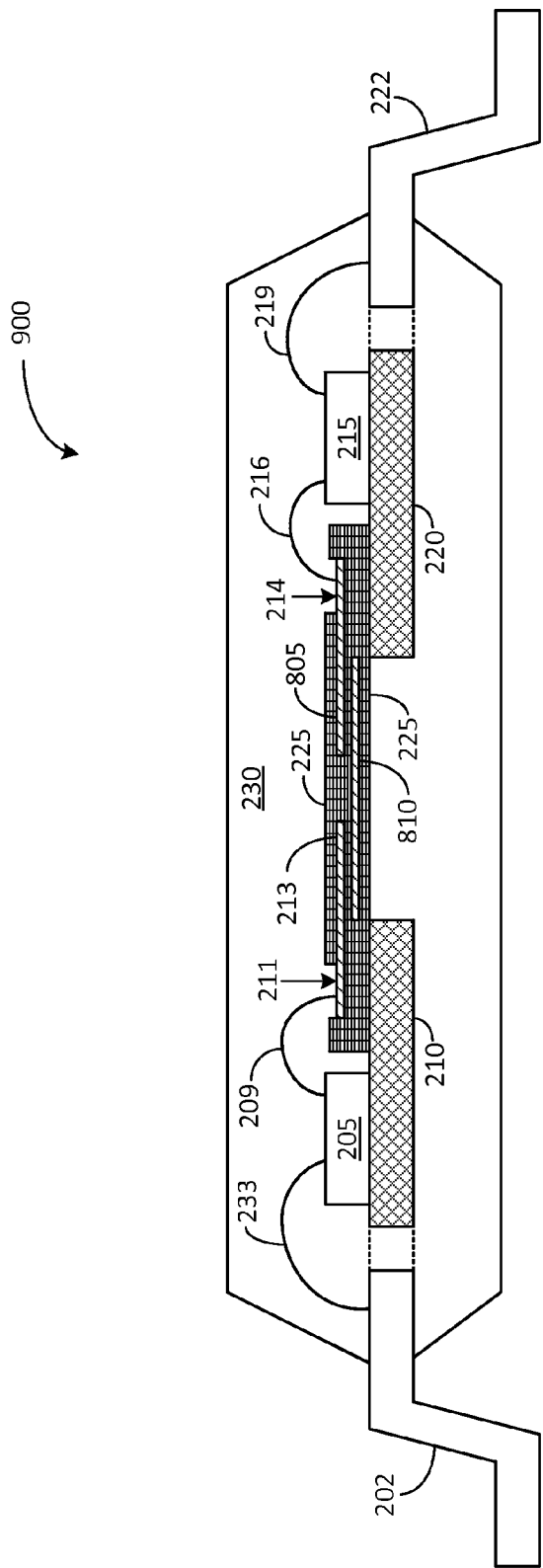
FIG. 9 provides a cross-sectional view of a fifth exemplary embodiment of an isolation barrier device in accordance with invention.

FIG. 9 provides a cross-sectional view of a fifth exemplary embodiment of an isolation barrier device 900 in accordance with invention. Device 900 includes a first die 205 coupled to a second die 215 through a serial capacitor arrangement embedded inside insulating material 225. In this exemplary embodiment, the serial capacitor arrangement includes two capacitors formed of three capacitor plates 213, 810 and 805 arranged in parallel to each other.

Specifically, capacitor plate 810 is embedded below capacitor plates 213 and 805 such that a first portion of capacitor plate 810 is located in parallel with a portion of capacitor plate 213, while a second portion of capacitor plate 810 is located in parallel with a portion of capacitor plate 805. With this configuration, capacitor plate 213 cooperates with capacitor plate 810 to operate as a first capacitor, while capacitor plate 805 cooperates with capacitor plate 810 as well, to operate as a second capacitor that is connected in series with the first capacitor.

Capacitor plate 213 includes bond pad 211 that is connected to first die 205 via bonding wire connection 209. Capacitor plate 805 includes bond pad 214 that is connected to second die 215 via bonding wire connection 216 thus coupling die 205 with die 215 via the serial capacitor arrangement.

It will be understood that the serial capacitor arrangement may be replicated for several conduction paths between the two dies, in a manner that is similar to that shown in FIGS. 4 and 6 for example. As disclosed above, multiple conduction paths provide various benefits, such as, for example, to accommodate coupling a variety of signals between the two dies, and to accommodate redundant signal paths that may be used in case of signal failure in one or more primary signal paths. As can be understood, the incorporation of one redundant serial capacitor arrangement provides for N:1 protection (where N≥1 indicates the number of multiple signal paths), the incorporation of more than one redundant serial capacitor arrangement provides for N:M protection (where N≥1, M>1 and M indicates the number of redundant signal paths).

It will be further understood that the embodiment shown in FIG. 9 bears some structural similarities (other than in the nature of the capacitor coupling) to the embodiment shown in FIG. 7 (where dies 205 and 215 are mounted on metal support paddles 210 and 225). Similarly, in yet another embodiment, the capacitor arrangement of the embodiment shown in FIG. 3 (where the dies 205 and 215 are mounted on insulating material 225) may be replaced or supplemented with the serial capacitor arrangement.

Figure 10:
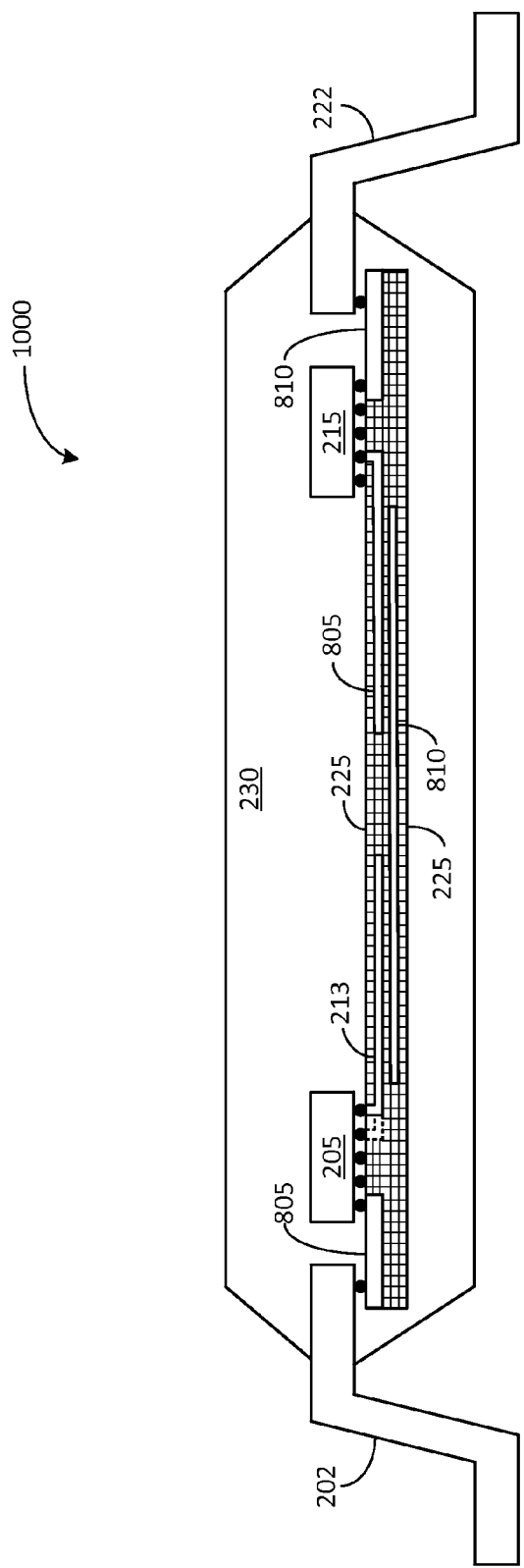
FIG. 10 provides a cross-sectional view of a sixth exemplary embodiment of an isolation barrier device in accordance with invention.

FIG. 10 provides a cross-sectional view of a sixth exemplary embodiment of an isolation barrier device 1000 in accordance with invention. In contrast to device 900 described above, which describes a configuration incorporating bond wires, device 1000 pertains to a flip-chip configuration. Some information about the flip-chip configuration can be understood from the description provided above with reference to FIG. 8 and will not be repeated herein.

Similar to device 900, device 1000 also includes a first die 205 coupled to a second die 215 through a serial capacitor arrangement embedded inside insulating material 225. The description and operation of serial capacitor arrangement can be understood from the description provided above with reference to FIG. 9 and will not be repeated herein.

However, it will be noticed that in this sixth exemplary embodiment, metal support paddles 210 and 220 have been eliminated. While this elimination may be carried out for a number of reasons, including cost and other practical considerations, it should be understood that in certain specific embodiments, where certain other considerations may come into play, metal support paddles 210 and 220 may be included.

Figure 11:
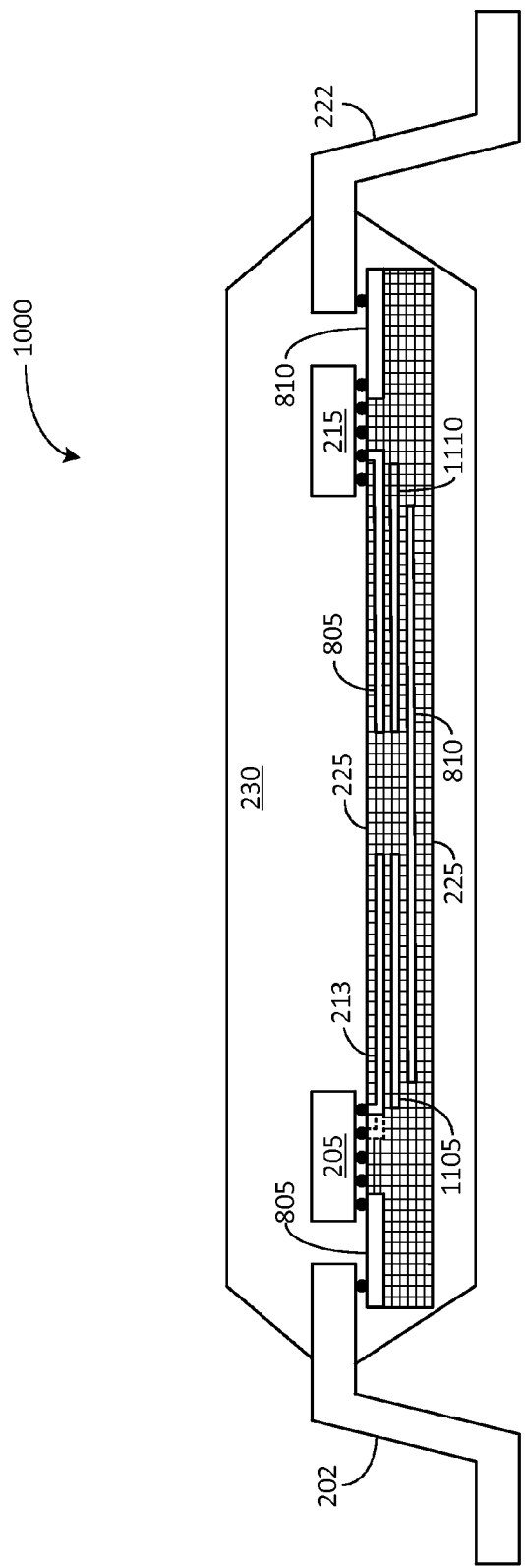
FIG. 11 provides a cross-sectional view of a seventh exemplary embodiment of an isolation barrier device in accordance with invention.

FIG. 11 provides a cross-sectional view of a seventh exemplary embodiment of an isolation barrier device 1000 in accordance with invention. While a large part of this embodiment is similar to that described using FIG. 10 above, attention is drawn to the series capacitor arrangement, which now includes two additional capacitor plates 1105 and 1110. Capacitor plate 1105 is embedded between capacitor plates 213 and 810, while capacitor plate 1110 is embedded between capacitor plates 805 and 810.

Capacitor plate 810 is embedded below capacitor plates 1105 and 1110 such that a first portion of capacitor plate 810 is located in parallel with a portion of capacitor plate 1105, while a second portion of capacitor plate 810 is located in parallel with a portion of capacitor plate 1110. With this configuration, capacitor plate 213 cooperates with capacitor plate 1105, which further cooperates with capacitor plate 810 to operate as a first series chain of two capacitors. Capacitor plate 810 cooperates with capacitor plate 1110, which further cooperates with capacitor plate 805 to operate as a second series chain of two capacitors. Capacitor plate 810 acting in common to the two series capacitor chain thus links the first series chain to the second series capacitor chain and forms an overall chain of four capacitors between die 205 and die 215.

Additional capacitor plates, which are similar to capacitor plates 1105 and 1110, may be added in other embodiments, thereby creating series capacitor chains that exceed four capacitors. Such a stacking arrangement permits a wide range of cascaded capacitive coupling values to be provided between dies 205 and 215.

The person skilled in the art will appreciate that the description herein is directed at explaining providing of isolation between two circuits (located on two dies) by using an intermediate isolation barrier formed of a certain type of insulating material. While the devices and methods have been described by means of specific embodiments and applications thereof, it is understood that numerous modifications and variations could be made thereto by those skilled in the art without departing from the spirit and scope of the disclosure.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A digital signal isolator device comprising:
    an isolation barrier comprising at least one of an organic or a semi-organic insulating material;
    a capacitor comprising a pair of parallel capacitor plates embedded inside the isolation barrier;
    a first metal support paddle located below a first portion of a bottom surface of the isolation barrier to provide support to the isolation barrier; and
    a second metal support paddle located below a second portion of a bottom surface of the isolation barrier to provide support to the isolation barrier.

2. The device of claim 1, wherein the organic insulating material comprises a polyimide.

3. The device of claim 1, wherein the semi-organic insulating material comprises a silicon-based polymer.

4. The device of claim 1, further comprising:
    a first die mounted at a first location on a major surface of the isolation barrier with a first bonding wire providing a first electrically conductive path between a first terminal of the first die and a first plate of the pair of parallel capacitor plates; and
    a second die mounted at a second location on the major surface of the isolation barrier, with a second bonding wire providing a second electrically conductive path between a first terminal of the second die and a second plate of the pair of parallel capacitor plates.

5. The device of claim 4, further comprising:
    a lead frame comprising a plurality of externally-accessible pins of the device;
    a third bonding wire providing a third electrically conductive path between a second terminal of the first die and at least one externally-accessible pin of the lead frame; and
    a fourth bonding wire providing a fourth electrically conductive path between a second terminal of the second die and at least another externally-accessible pin of the lead frame.

6. The device of claim 1, wherein the first metal support paddle extends beyond a first edge of the isolation barrier, the second metal support paddle extends beyond a second edge of the isolation barrier, and further comprising:
    a first die mounted on an extension portion of the first metal support paddle;
    a second die mounted on an extension portion of the second metal support paddle;
    a first bonding wire providing a first electrically conductive path between a first terminal of the first die and a first plate of the pair of parallel capacitor plates embedded inside the isolation barrier; and
    a second bonding wire providing a second electrically conductive path between a first terminal of the second die and a second plate of the pair of parallel capacitor plates embedded inside the isolation barrier.

7. The device of claim 6, further comprising:

a lead frame comprising a plurality of externally-accessible pins of the device;

a third bonding wire providing a third electrically conductive path between a second terminal of the first die and at least one externally-accessible pin of the lead frame; and a fourth bonding wire providing a fourth electrically conductive path between a second terminal of the second die and at least another externally-accessible pin of the lead frame.

8. A digital signal isolator device comprising:

a first metal support paddle;

a second metal support paddle that is electrically isolated from the first metal support paddle;

an isolation barrier comprising at least one of an organic or a semi-organic insulating material, the isolation barrier having a first portion supported by the first metal support paddle and a second portion supported by the second metal support paddle;

a pair of parallel capacitor plates embedded inside the isolation barrier;

a first die mounted at a first location on a major surface of the isolation barrier with a first bonding wire providing a first electrically conductive path between a first terminal of the first die and a first plate of the pair of parallel capacitor plates; and a second die mounted at a second location on the major surface of the isolation barrier, with a second bonding wire providing a second electrically conductive path between a first terminal of the second die and a second plate of the pair of parallel capacitor plates.

9. The device of claim 8, wherein the first metal support paddle includes a first externally-accessible pin of the device, and the second metal support paddle includes a second externally-accessible pin of the device.

* * * * *